(12) United States Patent
Offrein et al.

(10) Patent No.: US 7,470,069 B1
(45) Date of Patent: Dec. 30, 2008

(54) OPTOELECTRONIC MCM PACKAGE

(75) Inventors: Bert Jan Offrein, Schoenenberg (CH); Folkert Horst, Zurich (CH); Laurent Dellmann, Adliswil (CH); Casimer M DeCusatis, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/051,886

(22) Filed: Mar. 20, 2008

(51) Int. Cl.
G02B 6/36 (2006.01)
H04B 10/00 (2006.01)
H01L 21/00 (2006.01)
H01L 33/00 (2006.01)

(52) U.S. Cl. .................. 385/88; 385/14; 385/92; 398/135; 398/139; 438/29; 438/31; 257/184

(58) Field of Classification Search .......... 385/14, 385/15, 88, 89, 92, 49, 129, 130, 131, 132; 398/135, 139; 438/129, 130, 29, 31; 257/10–11, 257/53–56, 72, 113–118, 184–189, 225–234, 257/257–258, 290–294; 333/24, 141, 150, 333/157

See application file for complete search history.

(56) References Cited

U.S. PATENT DOCUMENTS

| 6,439,895 | B1 | 8/2002 | Li ............................ 439/17 |
| 6,453,081 | B1* | 9/2002 | Trezza et al. .................. 385/14 |
| 6,512,861 | B2 | 1/2003 | Chakravorty et al. .......... 385/14 |
| 6,611,635 | B1 | 8/2003 | Yoshimura et al. ............ 385/14 |
| 7,066,657 | B2* | 6/2006 | Murali et al. ................. 385/92 |
| 2005/0008303 | A1* | 1/2005 | Nishie et al. ................. 385/92 |
| 2005/0117853 | A1* | 6/2005 | Murali et al. ................. 385/88 |
| 2006/0078248 | A1 | 4/2006 | Sasaki et al. ................. 385/14 |

* cited by examiner

Primary Examiner—Brian M Healy
(74) Attorney, Agent, or Firm—The Law Firm of Andrea Hence Evans, LLC; Andrea H. Evans

(57) ABSTRACT

A structure for electronics package for module packaging and a method of manufacturing a single chip module (SCM) or multi-chip module (MCM) for an opto-electronic package having an improved structure for heat dissipation and testing is disclosed. The optical transceivers are ideally located on a surface opposite to the electrical portion of the package. Variations on the module package include pluggable or socketed optical transceivers and card pacers that allow for the installation of multiple optical transceivers.

1 Claim, 3 Drawing Sheets

OPTOELECTRONIC MCM PACKAGE

FIELD OF THE INVENTION

This invention relates to single (SCM) and multi-chip (MCM) modules. Specifically, it relates to optoelectronic modules having an optical transceiver to increase signal bandwidth density to and from the modules as well as the interconnect distance in devices ranging from high-end processors, switch and router chips that require large input/output (I/O) dataflow.

BACKGROUND OF THE INVENTION

Electrical interconnects exhibit limitations in scaling to even higher bandwidth density in tern-s of the maximum data rate per line, the interconnect distance, power and crosstalk. Optical interconnects may overcome these limitations. Parallel opto-electronic modules exist that transform several electrical signals into optical signals or vice-versa. However, the currently available modules are large in their size and the interconnect density at the electrical side is limited to the density that is available in standard printed circuit board technology. In order to enable optical technology to emerge in areas very close to the processor, the interconnect density between the processor and the optical module will have to be increased.

In SCM or MCM technology, the processor or switch chip is mounted onto a carrier substrate. This carrier does exhibit a large interconnect density and serves several functions. First it offers a high density interconnect between electronic components mounted on the carrier surface. Furthermore, the carrier is the interconnect medium between the processor(s) and the printed circuit board (PCB). In order to utilize the high interconnect density potential of optical technology, the optoelectronic elements have to be attached to the carrier substrate. Several approaches to bring optics to the SCM or MCM are described in the prior art.

In U.S. Pat. No. 6,512,861 B2 by Intel, the optoelectronic package is mounted on to the printed circuit board with embedded optical waveguides and a mirror is used to redirect the light.

In U.S. Pat. No. 6,611,635 B1 by Fujitsu, a variety of embodiments are disclosed where either a mirror is used to redirect the light, or the opto-electronic element is directly connected to the waveguide.

U.S. Pat. No. 6,439,895 B1 by Intel describes a socket compatible with optical and electrical interconnects in that it has an opening in the center to let optical signals pass through.

U.S. Published Patent Application No. 2006/0078248 A1 by NEC describes an opto-electronic package where the alignment between the board and the optical waveguides is achieved through pins.

SUMMARY OF THE INVENTION

It is an aspect of an embodiment of the present invention to provide a method to integrate optoelectronics onto a single chip module (SCM) or a multi-chip module (MCM) in order to increase the signal bandwidth density to and from the chip as well as the interconnect distance.

It is another aspect of an embodiment of the present invention to provide an optoelectronic module that is easier to lest than prior art devices.

It is yet another aspect of an embodiment of the present invention to provide a module package where the electrical and optical components are decoupled which will give the optics better stability.

It is yet a further aspect of an embodiment of the present invention to provide a short electrical via connection between the processors and the optoelectronic module to mitigate electrical signal interference.

DETAILED DESCRIPTION OF THE INVENTION

Figure 1:
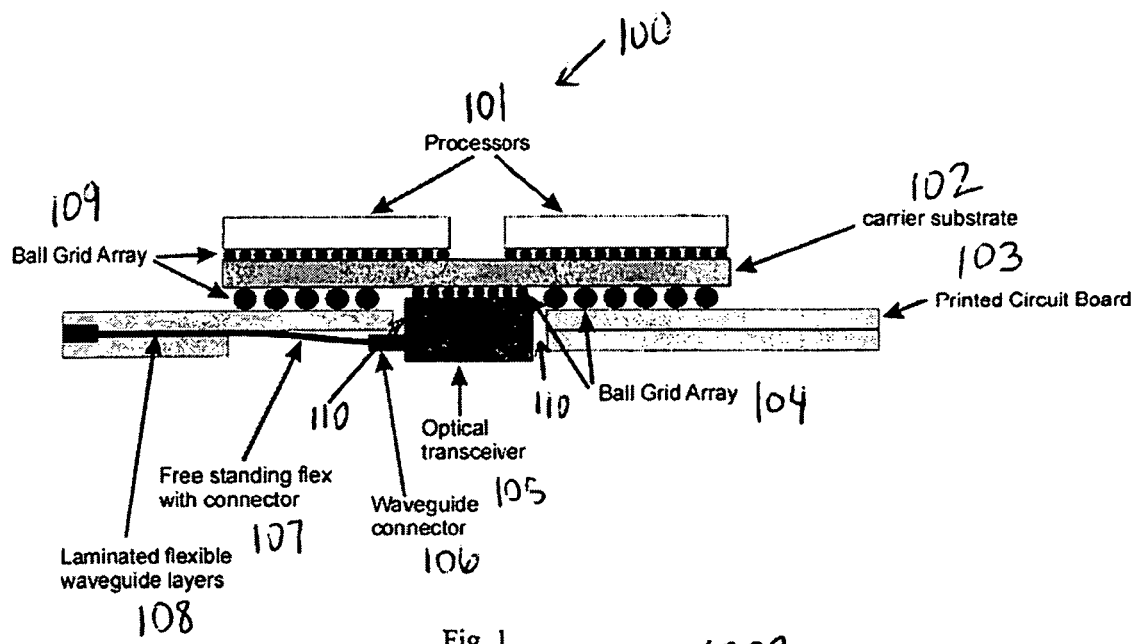
FIG. 1 is a cross sectional view according to an embodiment of the present invention.

The present invention will now be described in terms of the embodiment illustrated in FIG. 1. FIG. 1 shows an optoelectronic module or package 100 having processors 101. The processors 101 can be any of those known in the art. Preferably, the processors 101 are high-end processing chips or switch and router chips. Connected to the processors 101 is ball grid array 109. Ball grid array 109 connects the processors 101 to carrier substrate 102. The carrier substrate is connected to the printed circuit board 103 by ball grid arrays 109 and 104. Those skilled in the art will recognize that the present invention may use connectors other than ball grid arrays without departing from the scope of the present invention. Having the processors 101 above the printed circuit board 103 allows for the electronics heat to be dissipated upwards while the heat generated by optical transceiver 105 is dissipated downwards. Optical transceiver 105 is installed in circuit board openings 110. This allows for greater heat dissipation for the optical transceiver 105. Optical transceiver 105 is connected to waveguide connector 106. Free standing flexible connector 107 is attached to the optical transceiver 105 and to the laminated flexible waveguide layers 108 to destinations outside the module 100. It should be noted the optical signals in waveguide layers 108 is parallel to the carrier substrate 102. Additionally, the optical transceiver is perpendicular to the electrical elements or processors 101. The connectors and attachments in this embodiment are exemplary only. Those skilled the art will recognize that other types of connectors, attachments and waveguides may be substituted without departing from the scope of the instant invention. The embodiment shown in FIG. 1 provides ease of testing the electrical components separately from the optical components before assembly on the printed circuit board 103. Additionally, the layout illustrated in FIG. 1 allows for a smaller optical transceiver with reduced dimensions.

Figure 2:
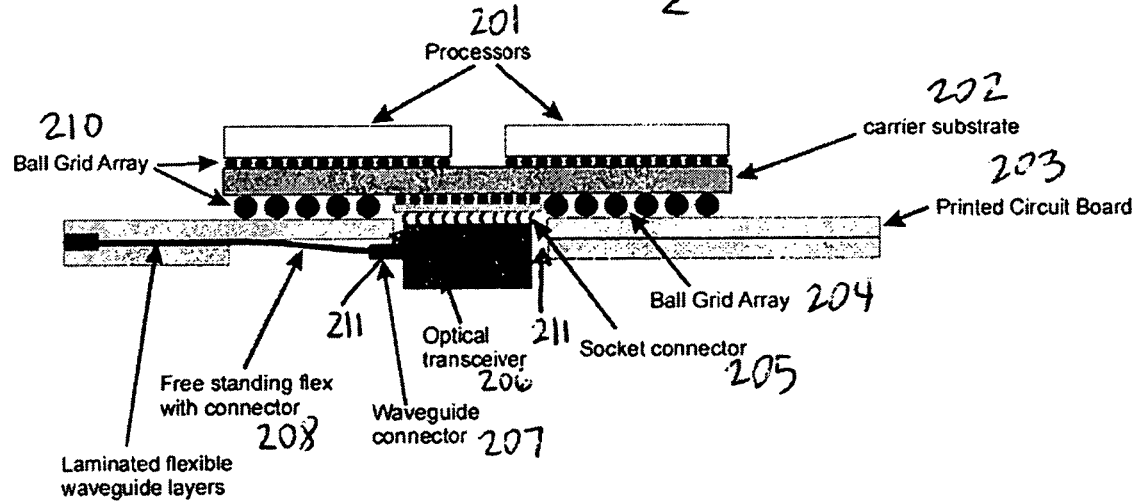
FIG. 2 is a cross sectional view according to a second embodiment of the present invention.

FIG. 2 is a variation of the embodiment of FIG. 1. FIG. 2 shows an optoelectronic module or package 200 having processors 201. The processors 201 are attached to a carrier substrate 202 via ball grid array 210. Printed circuit board 203 and carrier substrate 202 are attached via ball grid arrays 204 and 210. Adjacent to ball grid array 204 is a socket connector 205. Socket connector or plug 205 allows for the use of socketed or pluggable optical transceivers. It is desirable to use a common transceiver design for both card edge and MCM applications because of the ease of attaching the optical transceiver components to the circuit board 203. This may require additional space on the underside of the package so that the optical transceiver can be inserted into its electrical receptacle Additionally, this embodiment has waveguide connector 207, free standing flexible connector 208, circuit board openings 21 1 and laminated flexible waveguide layers 209 which are substantially similar to those discussed in reference to FIG. 1 above. The connectors and attachments in this embodiment are exemplary only. Those skilled the art will recognize that other types of connectors, attachments and waveguides may be substituted without departing from the scope of the instant invention.

Figure 3:
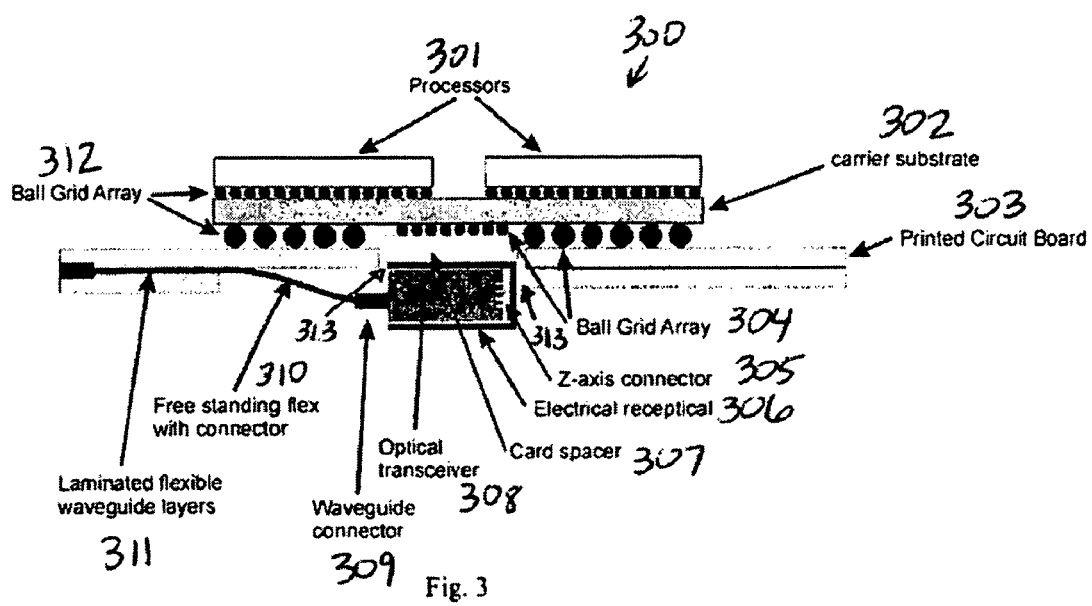
FIG. 3 is a cross sectional view according to a third embodiment of the present invention.

FIG. 3 shows another variation of the embodiment discussed in reference to FIG. 1. In this embodiment, the optoelectronic module or package 300 has been modified to include a card spacer 307, a Z-axis axis connector 305, and an electrical receptacle 306. This spacing element 307 can accommodate multiple optical transceivers 308, providing a spatial transform from the wiring density of the module substrate 302 to the density required from the optical transceiver 308. The assembly steps are modified so that the electrical receptacle 306 and card spacer 307 are both attached to the module package 300, then the pluggable optics 308 are inserted, followed by connection of the optical waveguide components 309-311. The ball grid arrays 304, 312 and circuit board openings 313 are substantially similar to those discussed in reference to FIG. 1. The connectors and attachments in this embodiment are exemplary only. Those skilled the art will recognize that other types of connectors, attachments and waveguides may be substituted without departing from the scope of the instant invention.

Figure 4:
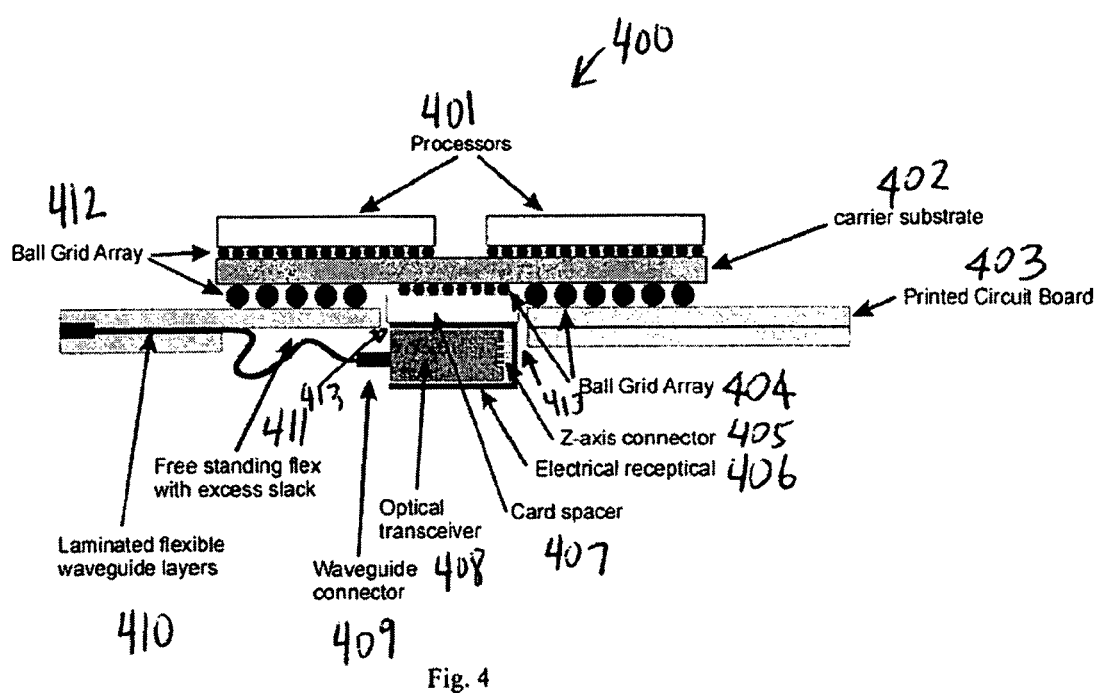
FIG. 4 is a cross sectional view according to a fourth embodiment of the present invention.

FIG. 4 is another variation on the embodiment discussed in reference to FIG. 1. In this embodiment, the opto-electronic module or package 400 has been modified with a free standing flex with excess slack 411. It may be desirable to provide excess slack in the waveguide/free standing flex for several reasons to allow for movement in package 400. The flex 411 can be shaped into a serpentine fashion, and optionally tacked down to the underside of the printed circuit board 403 using a small bead of epoxy or similar adhesive. Further, this embodiment contains the processors or electrical elements 401, a carrier substrate 402, a printed circuit board 403. The processors 401 are connected to the carrier substrate and printed circuit board via ball grid arrays 404 and 412. Similar to the configuration of FIG. 3, the optical transceiver 408 is installed in electrical receptacle 406 with Z-axis connector 406 and card spacer 407. Waveguide connector 409 is connected to flex 411 installed in the laminated flexible waveguide layers 410 to destinations outside the optoelectronic module 400. As in all the embodiments, the waveguide layer 410 guides the optical signal parallel to the carrier substrate 402 or printed circuit board 403 and the printed circuit board 402 has circuit board openings 413. The connectors and attachments in this embodiment are exemplary only. Those skilled the art will recognize that other types of connectors, attachments and waveguides may be substituted without departing from the scope of the instant invention.

The invention has been described in detail with particular reference to certain exemplary embodiments thereof, but it will be understood that variations and modifications can be effected within the spirit and scope of the invention.

The invention claimed is:

1. A method of manufacturing an opto-electronic module comprising:
   providing a circuit board having at least one circuit board opening;
   providing a carrier substrate having a top surface and a bottom surface different from the top surface;
   providing at least one electrical element attached to the top surface of the carrier substrate;
   providing at least one opto-electronic transceiver attached to the bottom surface of the carrier substrate substantially inserted into the at least one circuit board opening.

* * * * *